United States Patent
Shigihara et al.

(10) Patent No.: US 9,397,472 B2
(45) Date of Patent: Jul. 19, 2016

(54) SEMICONDUCTOR LASER DEVICE AND MANUFACTURING METHOD THEREOF

(71) Applicant: Mitsubishi Electric Corporation, Tokyo (JP)

(72) Inventors: Kimio Shigihara, Tokyo (JP); Kazushige Kawasaki, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 14/644,958

(22) Filed: Mar. 11, 2015

(65) Prior Publication Data

US 2015/0357789 A1 Dec. 10, 2015

(30) Foreign Application Priority Data

Jun. 6, 2014 (JP) ................... 2014-117723

(51) Int. Cl.
*H01S 5/028* (2006.01)
*H01S 5/02* (2006.01)
*H01S 5/10* (2006.01)

(52) U.S. Cl.
CPC ............. *H01S 5/0286* (2013.01); *H01S 5/0202* (2013.01); *H01S 5/028* (2013.01); *H01S 5/1082* (2013.01)

(58) Field of Classification Search
CPC .............................. H01S 5/0201; H01S 5/1082
See application file for complete search history.

(56) References Cited

U.S. PATENT DOCUMENTS

| 5,636,235 A * | 6/1997 | Miyazaki .............. H01S 5/4025 257/88 |
| 8,617,911 B2 * | 12/2013 | Onishi ................ H01S 5/02268 438/22 |
| 2008/0310471 A1 * | 12/2008 | Bessho ................. H01S 5/4043 372/44.01 |

FOREIGN PATENT DOCUMENTS

| JP | 2002-064237 A | 2/2002 |
| JP | 2012-064886 A | 3/2012 |

* cited by examiner

*Primary Examiner* — Dung Nguyen
(74) *Attorney, Agent, or Firm* — Studebaker & Brackett PC

(57) ABSTRACT

A method of manufacturing a semiconductor laser device includes the steps of: preparing the semiconductor laser bar body including a top surface, an undersurface, two mutually opposing facets, and two mutually opposing side faces, performing a coating step to form a coating film on the facet, and performing a division step after the coating step. The division step performs scribing on and divides the semiconductor laser bar body. A groove is formed on the facet by denting the facet, or is formed in the coating film by exposing a part of the facet, and the groove extends from the top surface to the undersurface. A width of the groove is 20 μm. Scribing is performed on the top surface or the undersurface so that a scribed track or an extended line of the scribed track meets the groove.

2 Claims, 8 Drawing Sheets

$Cl = (Lb - L) \tan(\theta)$ (WIDTH DIRECTION)

SEMICONDUCTOR LASER DEVICE AND MANUFACTURING METHOD THEREOF

BACKGROUND OF THE INVENTION

1. Field of the Invention

The present invention relates to a semiconductor laser device and a manufacturing method thereof.

2. Background Art

FIG. 10 is a perspective view illustrating a conventional semiconductor laser bar 100. The semiconductor laser bar 100 shown in FIG. 10 is provided with a semiconductor laser bar body 101, a front facet coating film 102 and a back facet coating film 103. A scribed track 104 is formed on one side of the semiconductor laser bar 100 and a blade 105 is placed on the opposite side thereof. The scribed track 104 is often drawn on a substrate surface side of the semiconductor laser bar body 101. By adding a force through the blade 105 to divide the semiconductor laser bar 100, it is possible to form a semiconductor laser chip 101a or a semiconductor laser mini bar.

The aforementioned conventional semiconductor laser device 100 has a uniformly flat facet and a coating film is provided on this facet. Normally, a division is made by applying scribing to a semiconductor laser bar after the coating film is provided.

The division is performed by pressing the blade 105 against a crystal growing surface which is opposite to a substrate surface on which the scribed track 104 shown in FIG. 10 is drawn so as to bend the semiconductor laser bar 100. The back facet coating film 103 is generally thicker than the front facet coating film 102. This is because low reflectivity is adopted for the front facet and high reflectivity is adopted for the rear facet so that more light is emitted from the front facet. A material for the front facet coating film 102 and the rear facet coating film 103 is an oxide, which is different from a semiconductor material for a semiconductor laser element body in material physical properties such as rigidity, Young's modulus and Poisson ratio. For this reason, regarding a substrate surface, the semiconductor laser bar body 101 and the rear facet coating film 103 are not simultaneously split when a division is started, and one of the two is split first.

FIG. 11 is a diagram illustrating an element division step of the conventional semiconductor laser bar 100. FIG. 11 shows a case where the rear facet coating film 103 is split first, but there is also a case where the semiconductor laser bar body 101 is split first. However, since these parts are not simultaneously split in anyway, on the corners on the semiconductor substrate side on which the scribed track 104 is formed, adhesion between the rear facet coating film 103 and the semiconductor laser bar body 101 is always weak or the rear facet coating film 103 is peeled.

The divided semiconductor laser chip 101a or semiconductor laser mini bar or the like are generally die-bonded to a submount 106 using solder. In this case, after being heated to a temperature equal to or higher than a melting point of the solder, the semiconductor laser chip 101a or semiconductor laser mini bar are bonded to the submount 106. Since the material of the coating film is different from the material of the semiconductor laser in material physical properties such as thermal expansion coefficient, distortion occurs in the coating film during heating and if the distortion exceeds a certain value, the coating film is easily peeled away from the facet of the semiconductor laser chip. The distortion value increases as the thickness of the coating film increases.

FIG. 12 is a diagram illustrating a coating film of a conventional semiconductor laser chip which has been peeled after die bonding, showing a semiconductor laser device obtained by bonding the semiconductor laser chip 101a and the submount 106 after being heated at 340° C. for 60 seconds. FIG. 12 illustrates the semiconductor laser chip 101a, the submount 106, a crystal growing surface side portion 107a of the semiconductor laser chip 101a and a substrate surface side portion 107b of the semiconductor laser chip 101a. FIG. 12 illustrates how the rear facet coating film is peeled on the corners of the substrate surface side portion 107b of the semiconductor laser chip 101a.

FIG. 13 is a diagram illustrating the coating film of the conventional semiconductor laser mini bar 101b which has been peeled. FIG. 13 shows the semiconductor laser mini bar 101b which has been heated at 390° C. for 30 seconds. FIG. 13 shows an example where the semiconductor laser mini bar 101b is simply heated at 390° C. for 30 seconds without being bonded to the submount 106. FIG. 13 shows how the rear facet coating film 108b on the corner on the substrate surface side is peeled as with the semiconductor laser chip 101a.

A similar phenomenon can also occur with the front facet coating film, but since the phenomenon is more prominent in the rear facet coating film which is thicker, the rear facet coating film has been described in the present Description of the Related Art by way of example.

Other prior art in relating to a semiconductor laser device includes Japanese Laid-Open Patent Publication No. 2012-64886. Although Japanese Patent Laid-Open No. 2012-64886 describes a semiconductor laser device having a groove, there is no description relating to the aforementioned peeling of the coating film.

As described above, when the conventional semiconductor laser bar 100 is divided after applying scribing thereto, an insufficient bonded region appears between the coating film and the semiconductor laser element body on corners of the chip of the semiconductor laser device. If the semiconductor laser device which has become a chip after the division is bonded to the submount 106 or the like using solder, there is a problem that the coating film is peeled caused by this insufficient bonded region.

SUMMARY OF THE INVENTION

The present invention has been implemented to solve the above-described problems and it is an object of the present invention to provide a semiconductor laser device and a manufacturing method thereof capable of preventing peeling of a coating film.

According to a first aspect of the present invention, a method of manufacturing a semiconductor laser device includes the steps of: preparing the semiconductor laser bar body, performing a coating step, and performing a division step after the coating step. The semiconductor laser bar body includes top surface, an undersurface, two mutually opposing facets, and two mutually opposing side faces, and the semiconductor laser bar body has a semiconductor laser element. The coating step forms a coating film on the facet. The division step performs scribing on the semiconductor laser bar body and divides the semiconductor laser bar body into a plurality of semiconductor laser device. A groove is formed on the facet by denting the facet, or is formed in the coating film by exposing a part of the facet, and the groove extends from the top surface to the undersurface. When a direction in which the two side faces are arranged is assumed to be a width direction, a width of the groove is equal to or less than a maximum value of a variation in a position of the scribing division. The division step is intended to perform scribing on the top surface or the undersurface so that a scribed track or an extended line of the scribed track meets the groove.

According to a second aspect of the present invention, a method of manufacturing a semiconductor laser device includes the steps of: preparing the semiconductor laser bar body, performing a coating step, and performing a division step after the coating step. The semiconductor laser bar body includes top surface, an undersurface, two mutually opposing facets, and two mutually opposing side faces, and the semiconductor laser bar body has a semiconductor laser element. The coating step forms a coating film on the facet. The division step performs scribing on the semiconductor laser bar body and divides the semiconductor laser bar body into a plurality of semiconductor laser device. The facet is flat from one side to the other side of the two side faces. A groove is provided in the coating film from the top surface to the undersurface, and the facet is partially exposed from the groove. The division step is intended to perform scribing on the top surface or the undersurface so that a scribed track or an extended line of the scribed track meets the groove.

According to a third aspect of the present invention, a method of manufacturing a semiconductor laser device includes the steps of: preparing the semiconductor laser bar body, performing a coating step, and performing a division step after the coating step. The semiconductor laser bar body includes top surface, an undersurface, two mutually opposing facets, and two mutually opposing side faces, and the semiconductor laser bar body has a semiconductor laser element. The coating step forms a front facet coating film on the front facet and forms a rear facet coating film on the rear facet. The division step performs scribing on the semiconductor laser bar body and divides the semiconductor laser bar body into a plurality of semiconductor laser device. The rear facet coating film includes a first portion on the undersurface side and includes a second portion which is thinner than the first portion on the top surface side. The scribing is performed on the top surface so that a scribed track or an extended line of the scribed track meets the groove.

According to a fourth aspect of the present invention, a semiconductor laser device includes: a semiconductor laser element body including a top surface, an undersurface, two mutually opposing facets, and two mutually opposing side faces; and a coating film provided on the facet.

Grooves that extends from the top surface to the undersurface is provided on corners of the semiconductor laser element body by denting both ends of the facet of the semiconductor laser element body or by not providing the coating film on the both ends of the facet. When a direction in which the two side faces are arranged is assumed to be a width direction, a width of the groove is equal to or less than 10 µm.

According to a fifth aspect of the present invention, a semiconductor laser device includes: a semiconductor laser element body including a top surface, an undersurface, two mutually opposing facets, and two mutually opposing side faces; and a coating film provided on the facet. The facet is flat from one side to the other side of the two side faces. With the coating film partially not provided on a corner of the semiconductor laser element body, an exposed portion that is part of the facet exposed is provided, and the exposed portion extends from the top surface to the undersurface.

According to a sixth aspect of the present invention, a semiconductor laser device includes: a semiconductor laser element body including a top surface, an undersurface, mutually opposing front facet and rear facet, and two mutually opposing side faces; and a rear facet coating film provided on the rear facet. The semiconductor laser device is configured to emit laser light from the front facet. The rear facet coating film has a first portion on the undersurface side and has a second portion which is thinner than the first portion at least on a corner of the semiconductor laser element body on the top surface side.

Other and further objects, features and advantages of the invention will appear more fully from the following description.

DETAILED DESCRIPTION OF THE PREFERRED EMBODIMENTS

Xyz coordinate axes will be shown in the following drawings as appropriate and the x-axis direction will also be referred to as a "width direction."

First Embodiment

Figure 1:
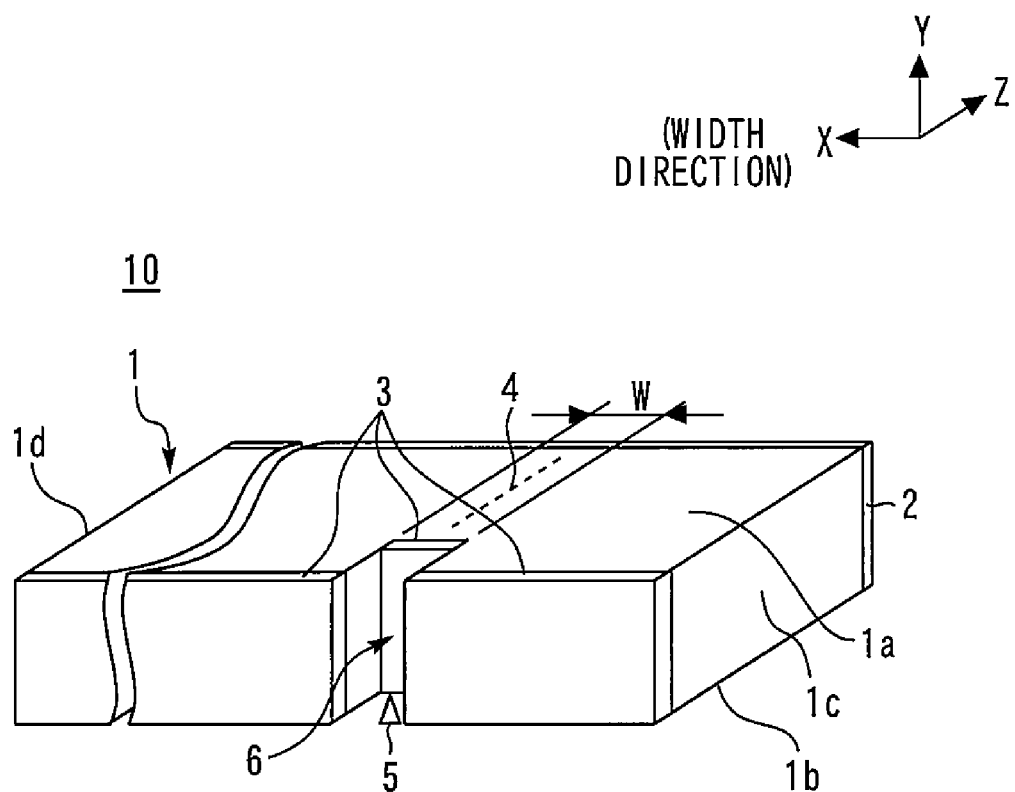
FIG. 1 is a diagram illustrating a method for manufacturing a semiconductor laser device according to a first embodiment of the present invention
Figure 2:
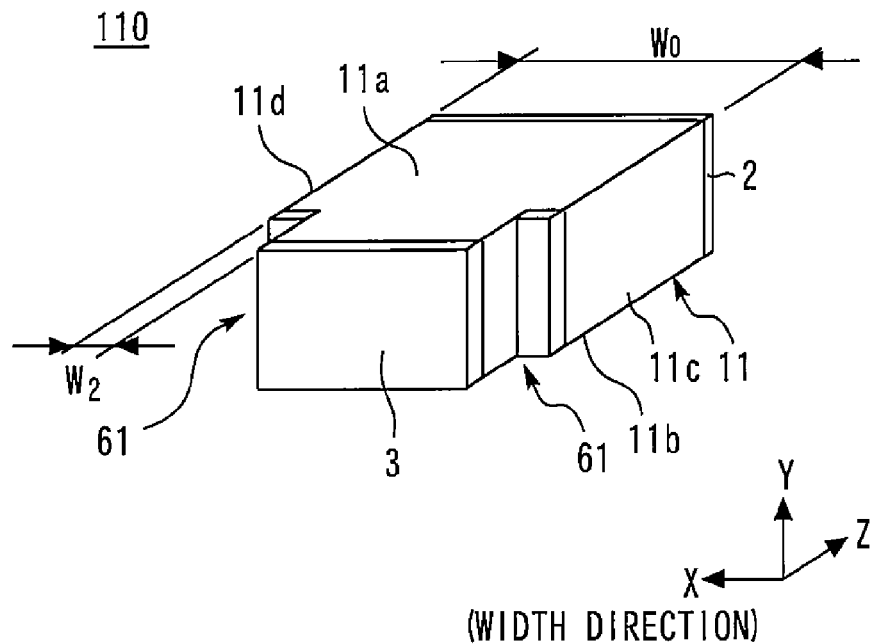
FIG. 2 is a diagram illustrating a semiconductor laser device according to the first embodiment of the present invention.

FIG. 1 is a diagram illustrating a method for manufacturing a semiconductor laser device 110 according to a first embodiment of the present invention and is a perspective view of a semiconductor laser bar 10 after scribing. The semiconductor laser bar 10 is provided with a semiconductor laser bar body 1, a front facet coating film 2 which is a side from which laser light is emitted and a rear facet coating film 3. The rear facet coating film 3 is thicker than the front facet coating film 2. Low reflectivity is adopted for the front facet and high reflectivity is adopted for the rear facet so that more light is emitted from the front facet. A material for the front facet coating film 2 and the rear facet coating film 3 is, for example, an oxide, and the semiconductor laser bar body 1 is a semiconductor, and both components have different material physical properties. Since a scribed track 4 is provided on a top surface 1a of the semiconductor laser bar body 1, the semiconductor laser bar 10 can be divided by pressing a blade 5 from an undersurface 1b. FIG. 2 is a diagram illustrating a semiconductor laser device 110 according to the first embodiment of the present invention, which is manufactured by dividing the semiconductor laser bar 10 according to the first embodiment.

More specifically, in the manufacturing method according to the present embodiment, a preparation step of preparing the semiconductor laser bar body 1 is performed first. The semiconductor laser bar body 1 is provided with the top surface 1a, the undersurface 1b, two mutually opposing facets and two mutually opposing side faces 1c and 1d. A semiconductor laser element is formed in the semiconductor laser bar body 1. Since the two facets are covered with the front facet coating film 2 and the rear facet coating film 3 respectively, these facets are not assigned any reference numerals in the drawing. When the semiconductor laser element is a Fabry-Perot type semiconductor laser element, the two facets become resonator faces. Though not shown, the semiconductor laser bar body 1 includes a semiconductor substrate on the top surface 1a side. On this semiconductor substrate, a plurality of semiconductor layers in which a crystal has grown toward the undersurface 1b side are provided. The plurality of semiconductor layers include, for example, an active layer, p-type and n-type guide layers sandwiching this active layer, and p-type and n-type clad layers sandwiching the guide layers. Finally, electrodes are formed on the top surface 1a and the undersurface 1b, respectively.

The semiconductor laser bar 10 is provided with a groove 6. The groove 6 is formed by denting the rear facet of the semiconductor laser bar body 1. The groove 6 continuously extends from the substrate surface side of the semiconductor laser bar body 1 (i.e. top surface 1a side) to the crystal growing surface side (i.e. undersurface 1b side). Though not shown in FIG. 1, a plurality of grooves 6 are provided spaced uniformly in the width direction of the semiconductor laser bar 10 (that is, x-axis direction). As will be described later, the scribed track 4 is provided on the top surface 1a side (that is, substrate surface side) through scribing in the dividing step. As an example, the groove 6 has a width of 20 μm and a depth of 10 μm. The position of the groove 6 is set so that the center of the width W is located on an extension of the scribed track 4. The width W of the groove 6 is equal to or less than a maximum value of a variation in the scribing division position. The maximum value of the scribing division position is preferably 20 μm. The width direction (that is, the x-axis direction) is a direction in which the two side faces 1c and 1d are arranged.

Thus, the width W of the groove 6 is assumed to be 20 μm because the maximum value of the variation in the division position according to the current scribing division technique, that is, the division position accuracy is on the order of ±10 μm. If the scribing division technique is improved in the future and the accuracy increases, the division position accuracy may be narrowed accordingly. If the width W of the groove 6 is assumed to be 20 μm, the value of 20 μm is a size of 1/500 in the semiconductor laser bar 10 having a width of 10 mm, a size of 1/200 for a semiconductor laser mini bar having a width of 4 mm, and a size of 2/50 (that is, 4%) for the semiconductor laser device 110 having a width Wo=500 μm shown in FIG. 2, which is a very small width.

Next, a coating step is performed. The coating step is intended to form the rear facet coating film 3 on the facet of the semiconductor laser bar body 1. In the first embodiment, the rear facet coating film 3 is provided also in the portion of the bottom of the groove 6. In the first embodiment, the groove 6 is provided only on the rear facet, but the present invention is not limited to this, and the groove 6 may also be provided only on the front facet or the groove 6 may be provided on both the front facet and rear facet. The coating film is generally manufactured using an electron beam vapor deposition method or a sputtering method, and therefore the rear facet coating film 3 is formed on the bottom of the groove 6 and a facet other than the groove 6. Coating of the front facet coating film 2 may also be performed separately and description thereof will be omitted.

Next, a division step is performed. In the division step, scribing is performed on the semiconductor laser bar body 10 after the coating step and the semiconductor laser bar body 10 is divided into a plurality of semiconductor laser devices 110. The division step is intended to perform scribing on the top surface 1a to form the scribed track 4 on the top surface 1a so that the scribed track 4 meets the groove 6, i.e. an extended line of the scribed track 4 and an extended line of the groove 6 cross each other. The semiconductor laser bar 10 is divided by causing the blade 5 to contact the undersurface 1b (that is, the crystal growing surface), applying tension to the top surface 1a side (that is, the substrate surface side) and placing a pressure on the undersurface 1b side.

Figure 12:
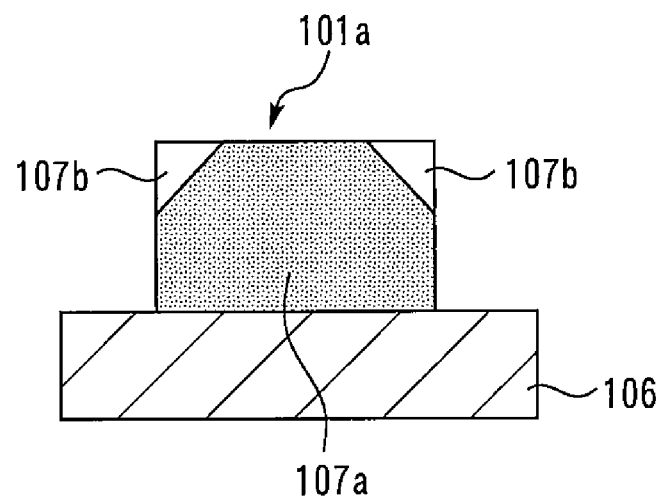
FIG. 12 is a diagram illustrating a coating film of a conventional semiconductor laser chip
Figure 13:
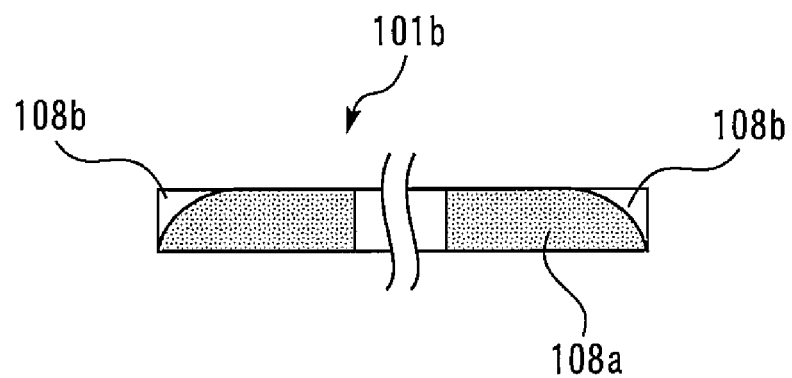
FIG. 13 is a diagram illustrating the coating film of the conventional semiconductor laser mini bar which has been peeled.

According to the first embodiment described above, it is possible to prevent peeling of the rear facet coating film 3 caused by the scribing. That is, adhesion between the semiconductor laser bar body 1 and the rear facet coating film 3 is weakened in the vicinity of the extension of the scribed track 4. As described in FIG. 12, when the semiconductor laser device converted into a chip is die-bonded to the submount using solder, peeling may occur from the corner portion. However, in the first embodiment, it is possible to confine the insufficient bonded region between the rear facet coating film 3 and the semiconductor laser element body 11 within the groove 6. This allows the peeling locations to be limited to within the groove 6 and thereby prevents peeling of the rear facet coating film 3 provided outside the groove 6.

The semiconductor laser device 110 shown in FIG. 2 is provided after the above-described division step. The semiconductor laser device 110 is provided with the semiconductor laser element body 11, the front facet coating film 2, and the rear facet coating film 3, and has a width Wo. The semiconductor laser element body 11 is provided with a top surface 11a, an undersurface 11b, two mutually opposing facets, and two mutually opposing side faces 11c and 11d. The rear facet coating film 3 is provided on one of the facets of the semiconductor laser element body 11. Grooves 61 that extend from the top surface 11a to the undersurface 11b is provided on corners of the semiconductor laser element body 11 by denting both ends of the facet of the semiconductor laser element body 11. When the direction in which the two side faces 11c and 11d are arranged is assumed to be a width direction, since the width W of the groove 6 is preferably 20 μm or less, a width $W_2$ of the groove 61 is preferably equal to or less than 10 μm. The groove 61 can prevent peeling of the rear facet coating film 3 caused by the scribing.

Aforementioned Japanese Patent Laid-Open No. 2012-64886 describes a technique for providing a concave portion in a facet of a semiconductor laser device to reduce film stress when forming a coating film. For example, paragraph 0018 of Japanese Patent Laid-Open No. 2012-64886 describes that it is preferable to reduce the contact area between the facet of the semiconductor laser device and the coating film by at least 50%, and it can be interpreted that the concave portion is formed in such a size. Compared to such a concave portion, the width W of the groove 6 and the width W₂ of the groove 61 in aforementioned the first embodiment are very small. That is, the concave portion provided in the semiconductor laser device in Japanese Patent Laid-Open No. 2012-64886 is different from the groove 6 and the groove 61 in the first embodiment in the object and configuration thereof.

Second Embodiment

Figure 3:
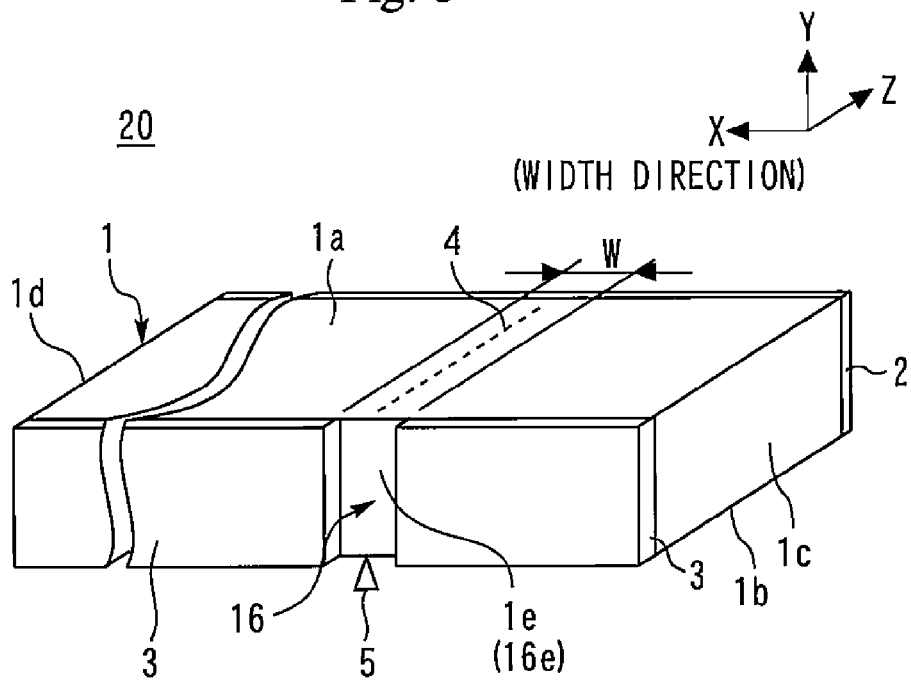
FIG. 3 is a diagram illustrating a method for manufacturing a semiconductor laser device according to a second embodiment of the present invention.
Figure 4:
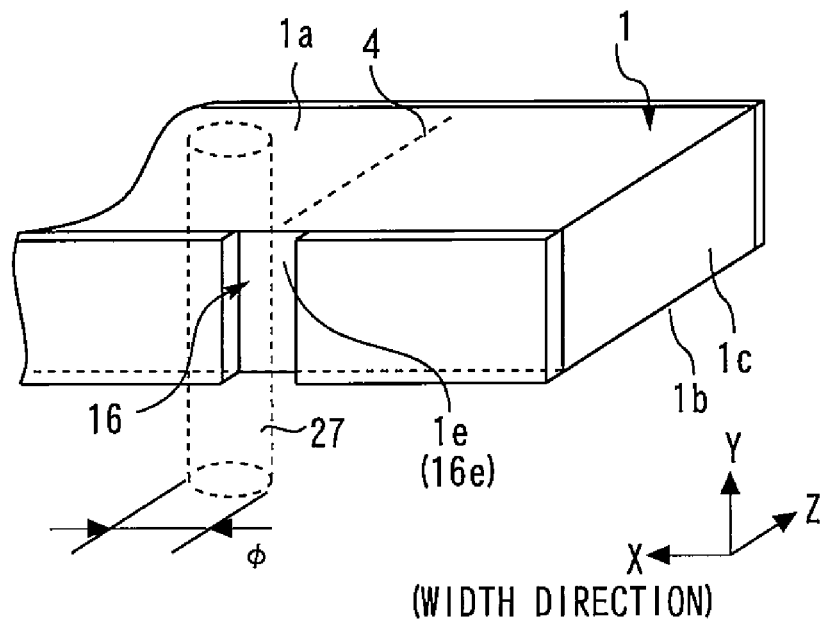
FIG. 4 is a diagram illustrating a method for manufacturing a semiconductor laser device according to a second embodiment of the present invention.
Figure 5:
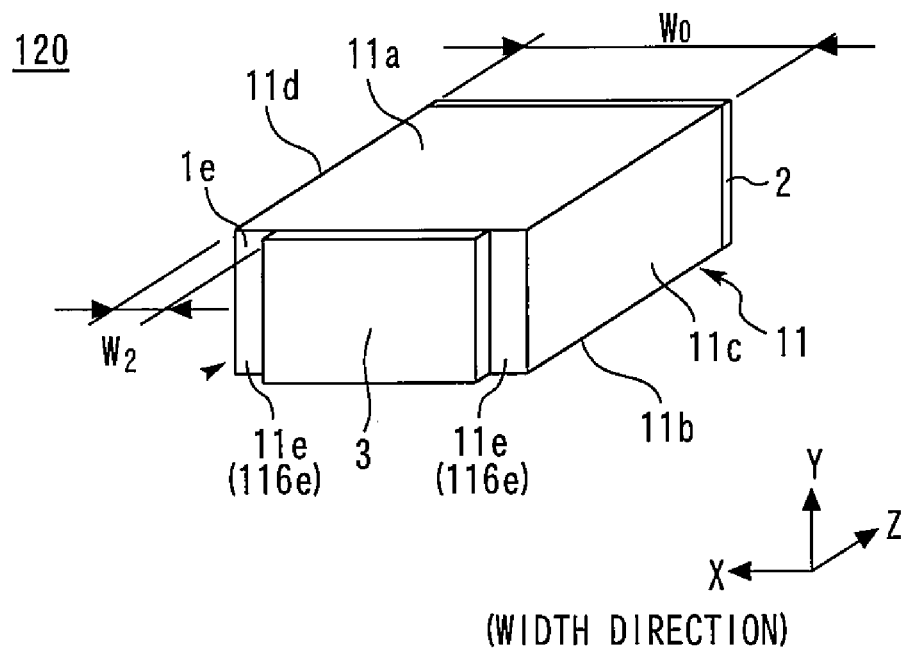
FIG. 5 is a diagram illustrating the semiconductor laser device according to the second embodiment of the present invention.

FIGS. 3 and 4 are diagrams illustrating a method for manufacturing a semiconductor laser device 120 according to a second embodiment of the present invention. More specifically, FIG. 3 is a perspective view of a semiconductor laser bar 20 after scribing. FIG. 5 is a diagram illustrating the semiconductor laser device 120 according to the second embodiment of the present invention, which is manufactured by dividing the semiconductor laser bar 20 according to the second embodiment.

A semiconductor laser bar body 1 is prepared in a preparation step first. The semiconductor laser bar body 1 is provided with a top surface 1*a*, an undersurface 1*b*, mutually opposing front facet (not shown) and rear facet 1*e*, and two mutually opposing side faces 1*c* and 1*d*. A semiconductor laser element is formed in the semiconductor laser bar body 1. The rear facet 1*e* is flat without any steps from one side to the other side of the two side faces 1*c* and 1*d*.

Next, a coating step is performed. FIG. 4 is a perspective view illustrating the coating step. The coating step is intended to form the rear facet coating film 3 on the rear facet 1*e*. A groove 16 is provided in the rear facet coating film 3 from the top surface 1*a* to the undersurface 1*b*. The rear facet 1*e* of the semiconductor laser bar body 1 is partially exposed from this groove 16. Hereinafter, the portion of the rear facet 1*e* exposed from the groove 16 will also be called an "exposed portion 16*e*."

Though not shown in FIG. 4, a plurality of grooves 16 are provided spaced uniformly in the width direction (that is, the x-axis direction) of the semiconductor laser bar 20. A width W of the groove 16 is equal to or less than a maximum value of a variation in the scribing division position. More specifically, the width W of the groove 16 can be set to on the order of 20 μm.

An example of the method of not forming the rear facet coating film 3 in part of the rear facet 1*e* will be described using FIG. 4. A bar-shaped shield 27 is used in the second embodiment. Since the rear facet coating film 3 is formed on the facet by causing a coating material to fly using an electron beam vapor deposition method or sputtering method or the like, if the shield 27 is placed in front of the rear facet 1*e*, the rear facet coating film 3 is not formed in part of the rear facet 1*e* hidden behind the shield 27. Examples of the shield 27 may include a gold wire having a diameter of 20 μm. The reason that the width of the shield 27 is assumed to be 20 μm is attributable to the scribing division position accuracy described in the first embodiment. If the division position accuracy improves, a shield 27 having a still smaller width may be applied.

Next, a division step is performed. The division step is intended to perform scribing on the semiconductor laser bar body 20 after the coating step to divide it into a plurality of semiconductor laser devices 120. The division step is intended to perform scribing on the top surface 1*a* to form the scribed track 4 so that the scribed track 4 meets the exposed portion 16*e* exposed from the groove 16, that is an extended line of the scribed track 4 and an extended line of the exposed portion 16*e* cross each other.

As described above, in the second embodiment, the groove 16 having a width on the order of 20 μm is provided on an extension of the scribed track 4 in the rear facet 1*e*. Since no rear facet coating film 3 exists in the region where the semiconductor laser bar 20 is divided, there is no insufficient bonded region itself between the semiconductor laser bar body 1 and the rear facet coating film 3. For this reason, no peeling of the rear facet coating film 3 occurs during die bonding to the submount 106 or the like.

A semiconductor laser device 120 shown in FIG. 5 is provided after the above-described division step. The semiconductor laser device 120 is provided with a semiconductor laser element body 11, a front facet coating film 2, and a rear facet coating film 3, and has a width of Wo. The semiconductor laser element body 11 is provided with a top surface 11*a*, an undersurface 11*b*, mutually opposing front facet (not shown) and rear facet 11*e*, and two mutually opposing side faces 11*c* and 11*d*. The rear facet 11*e* is flat without any steps from one side of the two side faces 11*c* and 11*d* to the other side. The rear facet coating film 3 is provided in a center of the rear facet 11*e*. With the rear facet coating film 3 partially not provided on both corners of the semiconductor laser element body 11, exposed portions 116*e* that extend from the top surface 11*a* to the undersurface 11*b* are provided. Each exposed portion 116*e* is part of the rear facet 11*e* exposed and has a width of W₂. The width W₂ is the same size as the groove 61 of the first embodiment. This makes it possible to prevent peeling of the rear facet coating film 3 caused by scribing.

In the second embodiment, the rear facet 1*e* is flat without any steps from the one side of the two side faces 1*c* and 1*d* to the other side. However, the present invention is not limited to this. A step may be provided in the rear facet 1*e*, and the groove 16 and the exposed portion 16*e* may be likewise provided in this case as well.

In the second embodiment, the rear facet coating film 3 is thicker than the front facet coating film 2, and therefore the groove 16 is provided in the rear facet coating film 3, but the present invention is not limited to this and the groove 16 may be provided in the front facet coating film 2.

Third Embodiment

Figure 6:
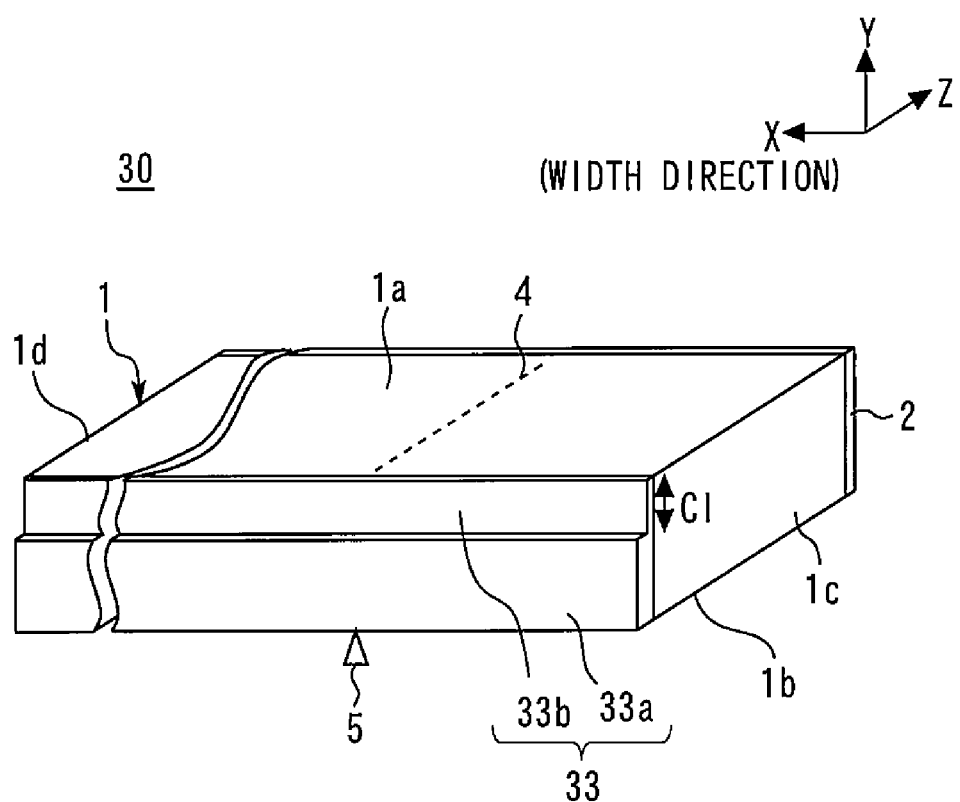
FIG. 6 is a diagram illustrating a method for manufacturing a semiconductor laser device according to the third embodiment of the present invention.
Figure 7:
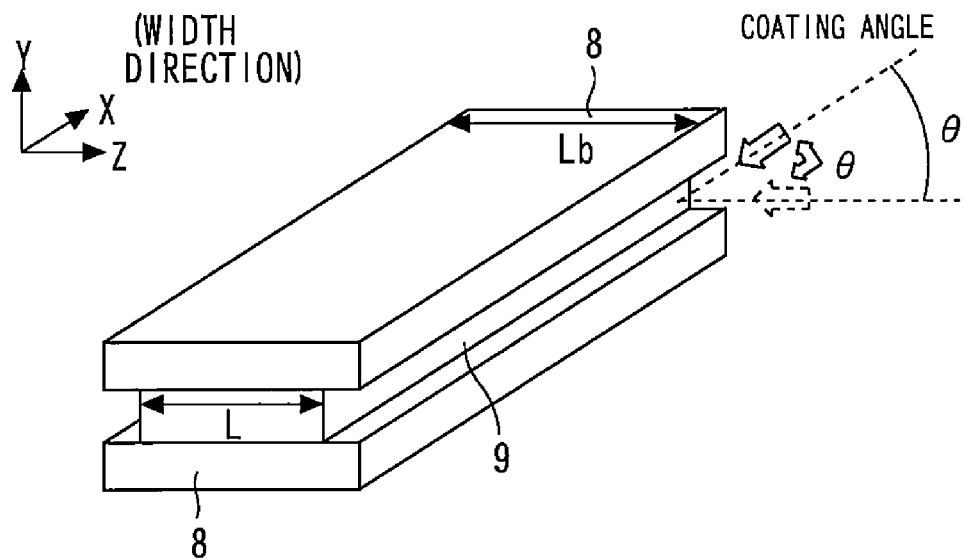
FIG. 7 is a diagram illustrating a method for manufacturing a semiconductor laser device according to the third embodiment of the present invention.
Figure 8:
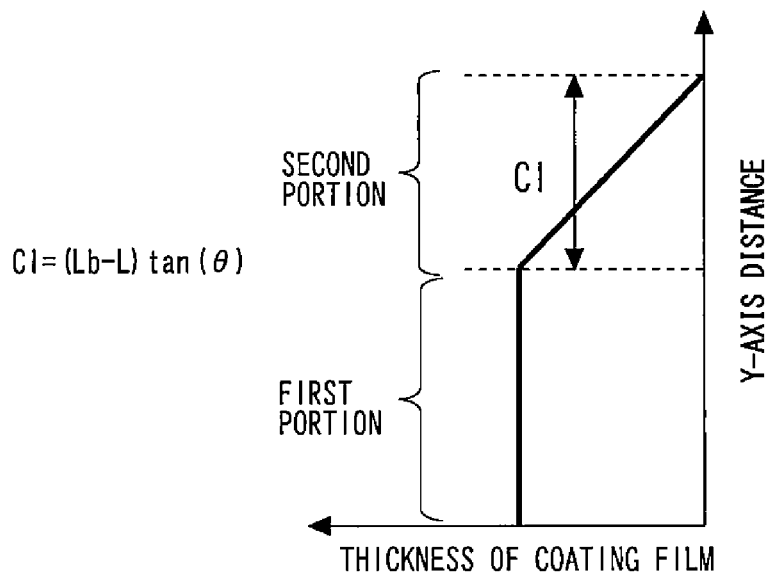
FIG. 8 is a diagram illustrating a method for manufacturing a semiconductor laser device according to the third embodiment of the present invention.
Figure 9:
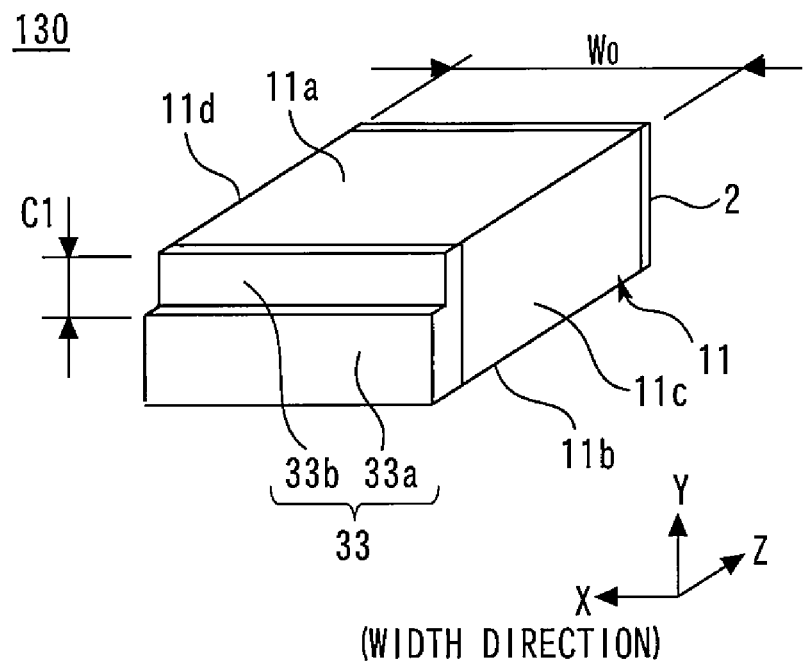
FIG. 9 is a diagram illustrating a semiconductor laser device according to the third embodiment of the present invention.
Figure 10:
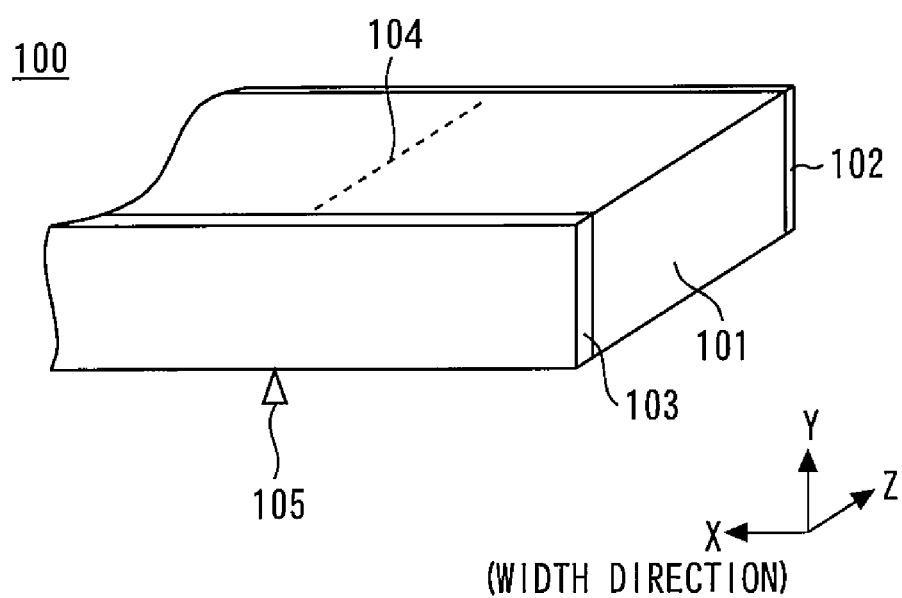
FIG. 10 is a perspective view illustrating a conventional semiconductor laser bar.
Figure 11:
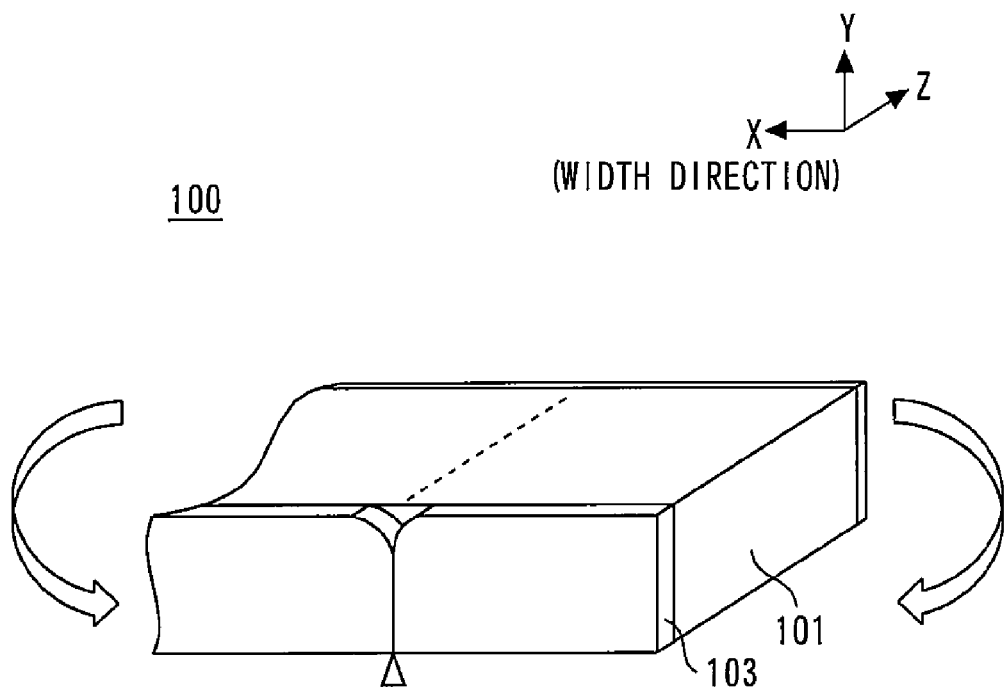
FIG. 11 is a diagram illustrating an element division step of the conventional semiconductor laser bar.

FIG. 6 to FIG. 8 are diagrams illustrating a method for manufacturing a semiconductor laser device 130 according to the third embodiment of the present invention. More specifically, FIG. 6 is a perspective view of a semiconductor laser bar 30 after scribing. FIG. 9 is a diagram illustrating a semiconductor laser device 130 according to the third embodiment of the present invention, which is manufactured by dividing the semiconductor laser bar 30 according to the third embodiment.

The semiconductor laser bar body 1 is prepared in a preparation step first. The semiconductor laser bar body 1 is provided with a top surface 1*a*, an undersurface 1*b*, two mutually opposing facets, and two mutually opposing side faces 1*c* and 1*d*. A semiconductor laser element is formed in the semiconductor laser bar body 1.

Next, a coating step is performed. The coating step is intended to form a rear facet coating film 33 on a facet. The rear facet coating film 33 includes a first portion 33*a* on the undersurface 1*b* side and includes a second portion 33*b* which is thinner than the first portion 33*a* on the top surface 1*a* side. FIG. 7 is a perspective view illustrating an example of a method for manufacturing the rear facet coating film 33 according to the third embodiment. The example of the manufacturing method shown in FIG. 7 illustrates a semiconductor laser bar 31 having a size of L in the z-axis direction and dummy bars 8 that sandwich the semiconductor laser bar 31 from above and below. In the case where the semiconductor laser element provided in the semiconductor laser bar 31 is a Fabry-Perot type semiconductor laser element, this size L corresponds to a resonator length. The size of the dummy bar 8 in the z-axis direction is Lb. A rear facet 9 of the semiconductor laser bar 31 is exposed from a gap between the two dummy bars 8. The size Lb of the dummy bar 8 in the z-axis direction is made to be greater than the size L of the semiconductor laser bar 30 in the z-axis direction.

In normal coating, the coating material is made to fly in a direction perpendicular to the rear facet 9. In contrast, in the third embodiment, the coating material is made to fly in a direction tilted by θ with respect to the normal of the rear facet 9 of the semiconductor laser bar 30. It is possible to create a shadow of the dummy bar 8 only in a region of length Cl= (Lb−L)tan(θ) on the substrate side of the rear facet 9 by setting the angle in this way. FIG. 8 is a graph illustrating a relationship between the thickness of the rear facet coating film 33 and the distance in the y-axis direction. The region in the shadow of the dummy bar 8 is considered ideally not to be coated, but there is actually a wraparound of the coating material. Thus, as shown in FIG. 8, the thickness of the second portion 33b decreases so that the rear facet coating film 33 becomes thinner as it approaches the substrate surface (that is, the top surface 1a). The angle θ can be adjusted easily if the semiconductor laser bar 30 itself is tilted.

Although FIG. 6 and FIG. 9 illustrate the first portion 33a and the second portion 33b in a stepped form so that their thicknesses become discontinuous, the present invention is not limited to the first portion 33a and the second portion 33b configured in the stepped shape, but the present invention may also be applicable to a configuration in which the second portion 33b has a slope along which its thickness gradually decreases as shown in FIG. 8. Note that a part of a minimum thickness of the second portion 33b is preferably zero as shown in FIG. 8.

Next, a division step is performed. The division step includes performing scribing on the semiconductor laser bar body 30 after the coating step and dividing it into a plurality of semiconductor laser devices 130. At this time, a scribed track 4 is provided by performing scribing on the top surface 1a and a blade 5 is made to come into contact with the undersurface 1b.

According to the third embodiment, the rear facet coating film 33 is provided with the first portion 33a and the second portion 33b. The second portion 33b is provided on the top surface 1a side (in other words, the substrate surface side), and the scribed track 4 is provided on the top surface 1a. A tension is applied to the second portion 33b when the semiconductor laser bar 30 is divided, while a pressure is applied to the first portion 33a.

Since the second portion 33b is formed to be thin, when a pressure is applied using the blade 5 in the division step, an adhesion failure is less likely to occur between the semiconductor laser bar body 1 and the rear facet coating film 33. For this reason, when the semiconductor laser device 130 divided into chips is die-bonded to a submount or the like using solder, peeling of the rear facet coating film 33 is less likely to occur. Moreover, the active layer from which light is emitted lies on the crystal growing surface side and the relatively thick first portion 33a is provided on the crystalline surface side, that is, the undersurface 1b side. Thereby, it is therefore possible to form a part of the rear facet coating film 33 near the active layer, i.e. the second portion 33a, to a normal thickness. Thus, there is an advantage that outgoing light through the second portion 33a perceives a normal reflectivity and a laser oscillating characteristic is the same as a normal one.

The semiconductor laser device 130 shown in FIG. 9 is provided after the division step. The semiconductor laser device 130 is provided with a semiconductor laser element body 11, a front facet coating film 2, and a rear facet coating film 33, and has a width of Wo. The semiconductor laser element body 11 is provided with a top surface 11a, an undersurface 11b, two mutually opposing facets, and two mutually opposing side faces 11c and 11d. The rear facet coating film 33 is provided on a rear facet. The rear facet coating film 33 has a first portion 33a on the undersurface 11b side and has a second portion 33b which is thinner than the first portion 33a at least on a corner of the semiconductor laser element body 11 on the top surface 11a side. This makes it possible to prevent peeling of the rear facet coating film 33 caused by scribing.

The third embodiment has described the rear facet coating film 33, but the present invention is not limited to this. The first portion 33a and the second portion 33b may also be likewise provided in only the front facet coating film 2. Alternatively, the first portion 33a and the second portion 33b may be likewise provided in both the front facet coating film 2 and the rear facet coating film 33. In the third embodiment, the second portion 33b is continuously provided in the width direction (that is, the x-axis direction) of the semiconductor laser bar 30. However the present invention is not limited to this. Part of the rear facet coating film 33 on an extended line of the scribed track 4 may be formed to be thin.

The features and advantages of the present invention may be summarized as follows. According to the first and fourth aspects of the present invention, a groove is provided at a part where the coating film may be possibly peeled, making it possible to prevent peeling of the coating film caused by scribing. According to the second and fifth aspects of the present invention, a part that exposes a facet is provided at a part where the coating film may be possibly peeled, making it possible to prevent peeling of the coating film caused by scribing. According to the third and sixth aspects of the present invention, a thin second portion is provided on the side of the top surface where scribing is performed, making it possible to prevent peeling of the coating film caused by scribing.

Obviously many modifications and variations of the present invention are possible in the light of the above teachings. It is therefore to be understood that within the scope of the appended claims the invention may be practiced otherwise than as specifically described. The entire disclosure of Japanese Patent Application No. 2014-117723, filed on Jun. 6, 2014 including specification, claims, drawings and summary, on which the Convention priority of the present application is based, is incorporated herein by reference in its entirety.

What is claimed is:

1. A method of manufacturing a semiconductor laser device, the method comprising the steps of:
   preparing the semiconductor laser bar body including a top surface, an undersurface, two mutually opposing facets, and two mutually opposing side faces, the semiconductor laser bar body having a semiconductor laser element;
   performing a coating step to form a coating film on at least one of the facets; and
   performing, after the coating step, a division step to scribe on the semiconductor laser bar body and to divide the semiconductor laser bar body into a plurality of semiconductor laser devices; wherein a groove is formed on the at least one of the facets by denting the at least one of the facets, or is formed in the coating film by exposing a part of the at least one of the facets, the groove extends from the top surface to the undersurface, when a direction in which the two side faces are arranged is assumed to be a width direction, a width of the groove is equal to or less than a maximum value of a variation in a position of the scribing division, and the division step is intended to perform scribing on the top surface or the undersurface so that a scribed track or an extended line of the scribed track meets the groove.

2. The method of manufacturing a semiconductor laser device according to claim 1, wherein the maximum value of the variation in the position of the scribing division is 20 μm.

\* \* \* \* \*